(12) United States Patent
Madril (10) Patent No.: US 10,184,639 B2
(45) Date of Patent: Jan. 22, 2019

(54) METHOD AND APPARATUS FOR SUBTENDING LIGHT

(71) Applicant: JST Performance, LLC, Gilbert, AZ (US)

(72) Inventor: Edgar A. Madril, Mesa, AZ (US)

(73) Assignee: JST Performance, LLC, Gilbert, AZ (US)

(*) Notice: Subject to any disclaimer, the term of this patent is extended or adjusted under 35 U.S.C. 154(b) by 10 days.

(21) Appl. No.: 15/640,981

(22) Filed: Jul. 3, 2017

(65) Prior Publication Data

US 2018/0010766 A1  Jan. 11, 2018

Related U.S. Application Data

(60) Provisional application No. 62/358,226, filed on Jul. 5, 2016.

(51) Int. Cl.
| | |
|---|---|
| *F21V 7/00* | (2006.01) |
| *F21V 5/04* | (2006.01) |
| *F21V 7/06* | (2006.01) |
| *G02B 3/00* | (2006.01) |
| *H05K 1/18* | (2006.01) |
| *F21Y 115/10* | (2016.01) |
| *F21V 13/04* | (2006.01) |

(52) U.S. Cl.
CPC ............ *F21V 5/04* (2013.01); *F21V 7/06* (2013.01); *G02B 3/00* (2013.01); *H05K 1/181* (2013.01); *F21V 13/04* (2013.01); *F21Y 2115/10* (2016.08); *H05K 2201/0999* (2013.01); *H05K 2201/10106* (2013.01); *H05K 2201/10121* (2013.01)

(58) Field of Classification Search
CPC ... F21V 5/04; F21V 7/06; F21V 13/04; G02B 3/00; H05K 1/181; H05K 2201/0999; H05K 2201/10106; F21Y 2115/10
See application file for complete search history.

(56) References Cited

U.S. PATENT DOCUMENTS

2016/0215955 A1* 7/2016 Donato ................ F21V 23/005

* cited by examiner

*Primary Examiner* — Ali Alavi (57) ABSTRACT

An optic configuration including a PCBA with one or more LEDs mounted thereon to emit light through a lens and a reflector. The optic configuration may be assembled within a cavity of a lighting fixture. At least a portion of the emitted light may be subtended by the lens, such that the lens may subtend light through a number of regions (e.g., three distinct regions). At least a portion of the emitted light may be subtended by the reflector, such that the reflector may subtend light from a number of surfaces (e.g., four surfaces). At least a portion of the light subtended by the lens may further be subtended by the reflector. The light subtended by the lens and/or the reflector may form a beam pattern including a high intensity spot portion and a lower intensity flood portion.

20 Claims, 7 Drawing Sheets

METHOD AND APPARATUS FOR SUBTENDING LIGHT

FIELD OF THE INVENTION

The present invention generally relates to lighting systems, and more particularly to an optic configuration for subtending light into a particular beam pattern.

BACKGROUND

Light emitting diodes (LEDs) have been utilized since about the 1960s. However, for the first few decades of use, the relatively low light output and narrow range of colored illumination limited the LED utilization role to specialized applications (e.g., indicator lamps). As light output improved, LED utilization within other lighting systems, such as within LED "EXIT" signs and LED traffic signals, began to increase. Over the last several years, the white light output capacity of LEDs has more than tripled, thereby allowing the LED to become the lighting solution of choice for a wide range of lighting solutions.

LED lighting solutions have introduced other advantages, such as increased reliability, design flexibility, and safety. Due to the vast amount of variability in selecting elements of a lighting solution, efforts continue to develop particular directional and patterned beams which cater to the specific application for which they are intended.

SUMMARY

To overcome limitations in the prior art, and to overcome other limitations that will become apparent upon reading and understanding the present specification, various embodiments of the present invention disclose a method and apparatus for subtending light.

In accordance with one embodiment of the invention, an optic configuration insertable between a media and a housing of a lighting fixture comprises a PCBA; one or more LEDs configured on the PCBA to emit light; a lens configured on the PCBA to subtend a portion of the emitted light from the LEDs into one or more subtended spans; and a reflector configured on the PCBA to subtend at least one of the one or more subtended spans from the lens, the reflector further configured to subtend a portion of the emitted light from the LEDs.

In accordance with another embodiment of the invention, a lighting fixture comprises a housing; an optic configuration configured on the housing, the optic configuration including a reflector with one or more tabs extending from the reflector; and a media configured over the optic configuration, wherein the media contacts the tabs, and wherein the tabs are configured to deflect in response to a force exerted on the media.

In accordance with another embodiment of the invention, method comprises emitting light from one or more LEDs; transforming a first portion of the emitted light into a first subtended span by passing the first portion of emitted light through a first region of a lens, such that the first subtended span is directed more closely to a principal optical axis of the lens; and transforming a second portion of the emitted light into a second subtended span by passing the second portion of emitted light through a second region of the lens, such that the second subtended span is directed away from the principal optical axis of the lens.

BRIEF DESCRIPTION OF THE DRAWINGS

Various aspects and advantages of the invention will become apparent upon review of the following detailed description and upon reference to the drawings in which.

DETAILED DESCRIPTION

Generally, the various embodiments of the present invention are applied to an apparatus for or a method of subtending light into a particular beam pattern. Specifically, the present invention includes an optic configuration that subtends emissions (e.g., light) into a beam pattern having spot characteristics, flood characteristics, or both. Subtending of emissions may refer to a change in the directional and/or other characteristics of the emissions (e.g., refracting, reflecting, or otherwise changing a direction or phase velocity or other characteristic of the emission). For example, subtending may be performed by one or more of a lens and/or a reflector. Spot characteristics may refer to a relatively narrow beam of high luminous intensity lighting. Flood characteristics may refer to a relatively wide beam of lower luminous intensity lighting (e.g., lower luminous intensity than that of the spot characteristics).

The optic configuration may be disposed within a lighting fixture that may be mountable to any stationary or moveable structure thereby enabling the optic configuration to illuminate an environment surrounding the structure. The optic configuration may include a printed circuit board (PCB), one or more LEDs, a lens, and a reflector, which may be integrated in such a way so that all or substantially all emitted light is subtended into the particular beam pattern.

For example, the PCB may be combined with one or more LEDs and associated control circuitry to form a PCB assembly (PCBA) that may enable powering and control of the LEDs. The LEDs may be configured to emit light in a specified range and substantially away from the PCBA. The lens may be positioned to capture and/or utilize at least a portion of the light emitted by the LED. For example, the lens may subtend emitted light in at least three distinct regions (e.g., first, second, and third regions) to produce corresponding subtended spans of light (e.g., first, second, and third subtended spans corresponding to the first, second and third regions, respectively). The subtended spans of light may be any one or more of collimated light (e.g., light rays passing substantially parallel to each other after being subtended), focused light (e.g., light rays passing in a narrower or wider span after being subtended), shifted light (e.g., light rays passing in a substantially different direction after being subtended), and/or diffused light (e.g., light rays that are scattered after being subtended).

The reflector may be positioned to capture and/or utilize at least a portion of the light emitted by the LEDs (e.g., light passing directly from the LEDs to the reflector). Further, the reflector may be positioned to capture and/or utilize at least a portion of the light subtended by the lens (e.g., light passing from the LEDs, through the lens, to the reflector). For example, the first subtended span of light may be further subtended by the reflector into a fourth subtended span of light. In another example, the second subtended span of light may be further subtended by the reflector into a fifth subtended span of light. In another example, one or more portions of the light emitted by the LEDs may be subtended by the reflector (e.g., without being subtended by the lens) into one or more subtended spans of light (e.g., sixth and seventh subtended spans). The subtended spans of light may be any one or more of collimated light, focused light, shifted light, and/or diffused light.

In accordance with the above principles, the light emitted by the LEDs may be divided into several portions, some of which may pass through the distinct regions of the lens, some of which may pass directly to one or more surfaces of the reflector, and some of which may pass through the lens to the reflector (e.g., substantially no light escapes the optic configuration without being subtended by the lens or the reflector). For example, no emitted light may escape the optic configuration as spill light (e.g., without being subtended). In another example, less than a small percentage (e.g., two percent) of the emitted light may escape as spill light.

Accordingly, each portion of the emitted light may be independently subtended (e.g., via reflection and/or or refraction) so that the corresponding subtended span of light passes away from the PCB in a particular direction. Thus, each subtended span may be individually configured such that when combined with every other subtended span, the resulting beam pattern may exhibit specific characteristics (e.g., spot and/or flood characteristics).

The manner in which emitted light is subtended by regions of the lens and/or surfaces of the reflector may further enable the optic configuration to be reduced in size (e.g., as compared to a traditional optic configuration) while maintaining a relatively high efficiency of light distribution. The precise manner in which this reduction in size is enabled may be described in greater detail in one or more of the following embodiments.

Figure 1:
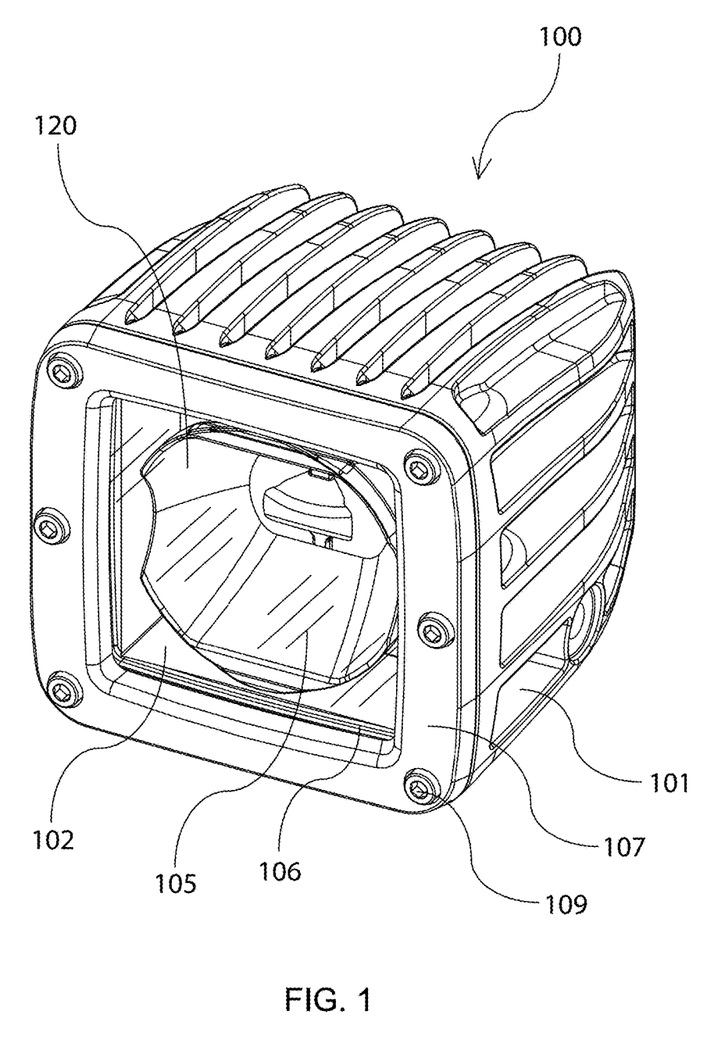
FIG. 1 illustrates an isometric view of a lighting fixture containing an optic configuration, according to an embodiment of the present invention.

FIG. 1 illustrates a lighting fixture 100 containing an optic configuration 120, according to an embodiment of the present invention. The lighting fixture 100 may include a housing 101 with a cavity 102 therein for containing the various components of the lighting fixture 100. For example, optic configuration 120 may be contained within cavity 102 of housing 101. At least one bezel 107 may extend along a portion of housing 101 to enable securement of a media 105 (indicated by cross-hatching) across cavity 102.

For example, bezel 107 may extend around a perimeter of cavity 102. In another example, media 105 may substantially enclose cavity 102. In another example, bezel 107 may be secured to housing 101 by one or more fasteners 109. In another example, media 105 may be sealed to housing 101 by at least one gasket 106. Gasket 106 may extend around at least a portion of the perimeter of cavity 102. In another example, attachment of bezel 107 to housing 101 may cause securement of media 105 with gasket 107 being compressed and/or deformed between media 105 and housing 101. In another example, attachment of bezel 107 to housing 101 may cause compression and/or securement of optic configuration 120 between media 105 and housing 101.

Figure 7:
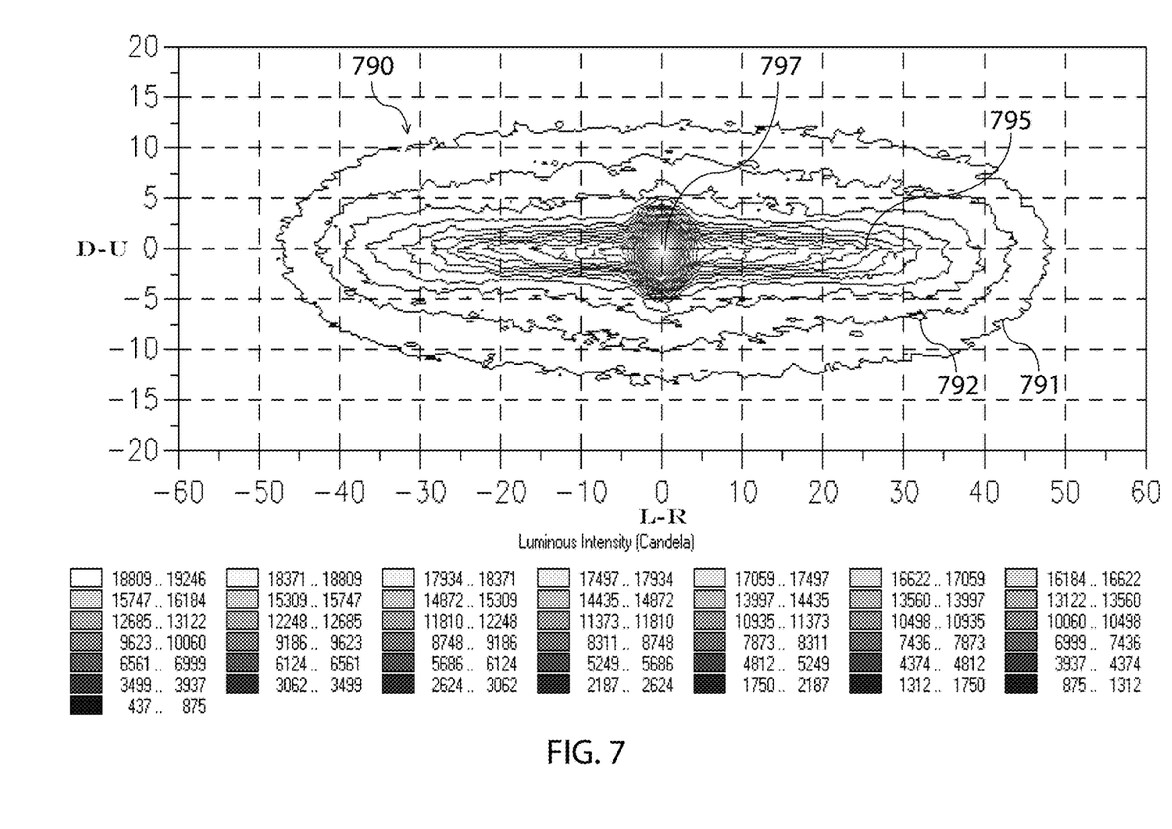
FIG. 7 illustrates an isocandela plot of a beam pattern produced by the optic configuration of FIG. 1.

In general, optic configuration 120 may enable light emitted by a first set of one or more LEDs (e.g., LEDs 230 of FIG. 2) to be subtended as the light passes outwardly from cavity 102 beyond optic configuration 120. For example, optic configuration 120 may collimate, focus, shift, and/or diffuse light emitted by the first set of LEDs as it passes outwardly from cavity 102. Furthermore, light generated by lighting fixture 100 may exhibit a particular beam pattern and/or may exhibit varying light intensities across vertical and horizontal dimensions thereof (e.g., as illustrated in FIG. 7).

Optic configuration 120 may be smaller than cavity 102, such that a perimeter of optic configuration 120 (e.g., the perimeter of a forward opening 355 of reflector 350 of FIG. 3) may be smaller than the perimeter of cavity 102, which may enable light emitted by a second set of one or more LEDs (e.g., LEDs 235 of FIG. 2) to pass outwardly from cavity 102 without being subtended by optic configuration 120. For example, light emitted by the second set of LEDs may produce a backlighting effect (e.g., light may be emitted outside the perimeter of optic configuration 120 but inside the perimeter of cavity 102). Alternatively, the second set of one or more LEDs may emit light both inside and outside the perimeter of optic configuration 120.

Figure 2:
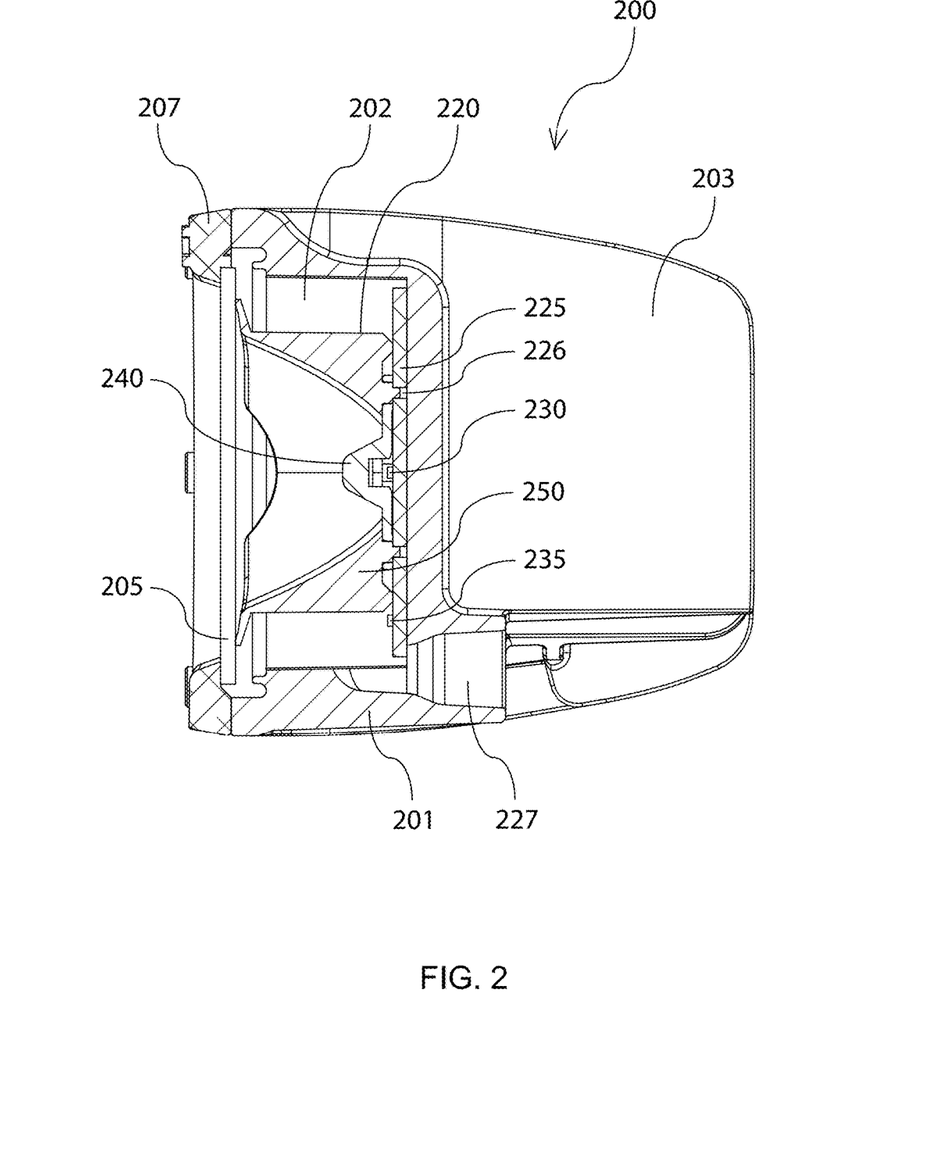
FIG. 2 illustrates a cross-sectional view of the lighting fixture of FIG. 1.

FIG. 2 illustrates a cross-sectional view of a lighting fixture 200 containing an optic configuration 220 for subtending light emitted by the optic configuration 220. The lighting fixture 200 may include a housing 201 with a cavity 202 therein for containing optic configuration 220. At least one bezel 207 may extend along a portion of housing 201 to enable securement of a media 205 across cavity 202. Media 205 may be formed of any suitable material to optimize transmittal of light therethrough (e.g., polycarbonate). For example, media 205 may be transparent, translucent, opaque, and/or may have distinct regions of transparence, translucence, and/or opaqueness to produce a lighting effect.

Optic configuration 220 may include one or more PCBAs 225 with control circuitry (not shown) for regulating power provided to one or more LEDs (e.g., LEDs 230, LEDs 235). PCBA 225 may receive power via a cable (not shown) extending through an egress 227 extending into housing 201. Further, PCBA 225 may include one or more slots 226 for alignment and/or interconnection with other components of the optic configuration (e.g., with a reflector 250).

One or more LEDs 230 and one or more LEDs 235 may be oriented to emit light away from PCBA 225. For example, light may be emitted through cavity 202, through media 205, and/or both. In another example, light may be emitted outwardly from housing 201 (e.g., directionally toward an area where it is desired to have light travel). In another example, LEDs 230 may be operable independently, interdependently, and/or collectively with LEDs 235. In another example, LEDs 230, 235 may emit light at wavelengths outside the visible spectrum (e.g., ultraviolet and/or infrared emission). In another example, LEDs 230 may emit light having multiple wavelengths throughout the visible spectrum (e.g., white light). In another example, LEDs 235 may emit light having substantially one wavelength in the visible spectrum (e.g., one of red, orange, yellow, green, blue, indigo and/or violet).

LEDs 230, 235 may produce heat during operation. Heat may be conducted away from LEDs 230, 235 by PCBA 225, housing 201, or both. For example, housing 201 may include one or more fins 203 to optimize conduction of heat away from LEDs 230, 235 and further the one or more fins 203 may be optimized to facilitate passage of heat to an environment external to cavity 202 (e.g., via convection to the environment around housing 201). In another example, PCBA 225 may include metal backing (e.g., aluminum), to further enable conduction of heat away from LEDs 230, 235.

Optic configuration 220 may include at least one lens 240 and at least one reflector 250 for subtending light emissions from LEDs 230. For example, light emissions from LEDs 230 may be subtended by lens 240, then by reflector 250. In another example, light emissions from LEDs 230 may be subtended only by lens 240. In another example, light emissions from LEDs 230 may be subtended only by reflector 250. In another example, light emissions from LEDs 230 may be completely subtended by either lens 240, reflector 250, or both (e.g., a first portion of the light emissions may be subtended only by lens 240 and a second portion of the light emissions may be subtended only by reflector 250). In another example, light emissions from LEDs 230 may be subtended by reflector 250, then by lens 240. Subtended light emissions from LEDs 230 may be collimated, focused, shifted, and/or diffused by lens 240, reflector 250, in any combination thereof.

Thus, optic configuration 220 may cause all or substantially all the light emissions from LEDs 230 to be subtended as they pass from lighting fixture 200. The light emissions from LEDs 230, as subtended by optic configuration 220 may exhibit a lighting effect (e.g., a particular beam pattern) and/or may exhibit varying intensities across vertical and horizontal dimensions thereof (e.g., as illustrated in FIG. 7). For example, the light emissions from LEDs 230 may form a high intensity spot photometric distribution. In another example, the light emitted by LEDs 230 may be configured to enable an operator to see environmental conditions in the vicinity of where light is emitted (e.g., at a distance of 40 feet).

LEDs 235 may be positioned such that a substantial portion of light emitted thereby may not pass through either of lens 240 or reflector 250. For example, light emissions from LEDs 235 may not be subtended. In another example, a substantial portion of light emissions from LEDs 235 may not be subtended. In another example, a first portion of light emissions from LEDs 235 may not be subtended, and second portion of light emissions from LEDs 235 may be subtended (e.g., by lens 240 and/or reflector 250). Light emissions from LEDs 235 may pass through cavity 202 to create a lighting effect (e.g., a backlighting effect) substantially different from the lighting effect created by LEDs 230, lens 240, and reflector 250 (e.g., a forward projecting lighting effect having a particular beam pattern, as exemplified in FIG. 7). For example, the light emissions from LEDs 235 may form a low intensity flood photometric distribution (e.g., as compared to LEDs 230). In another example, the light emitted by LEDs 235 may be configured to enable an operator to see the light emanating from housing 201, but may not be of high enough intensity to see environmental conditions at a substantial distance.

FIGS. 3A-D illustrate front, top, right, and back side views of an optic configuration 320, respectively, omitting a PCBA and corresponding LEDs, such that each view may include at least a lens 340 and a reflector 350. Reflector 350 may include a hollow interior formed by one or more surfaces (e.g., surfaces 351, 352, 353, 354). For example, the one or more surfaces may form a continuous wall having a forward opening 355 at a forward perimeter of the wall and a rearward opening 356 at a rearward perimeter of the wall. In another example, the one or more surfaces may be reflective. In another example, the one or more surfaces may be formed of a reflective coating (e.g., aluminum). In another example, the one or more surfaces may have a predefined reflectivity between about 0.85 and about 0.95 (e.g., approximately 0.9). Thus, the hollow interior may extend from the forward opening 355 to the rearward opening 356.

The one or more surfaces may include at least a first surface 351 and/or a second surface 352 for subtending emissions from the LED. Surfaces 351, 352 may be flat, curved, convex, concave, parabolic, or any other suitable shape to subtend light (e.g., via reflection). For example, surfaces 351, 352 may be formed of a single parabolic trough (e.g., having collinear principal focal axes). In another example, each surface 351, 352 may be formed of its own parabolic trough (e.g., having distinct parallel or non-parallel principal focal axes). The first and second surfaces 351, 352 may produce a first subtending effect. For example, first and second surfaces 351, 352 may focus emitted light along a vertical dimension of the parabolic trough to produce flood characteristics (e.g., a beam pattern of angular width). In another example, first and second surfaces 351, 352 may collimate emitted light along a vertical dimension of the parabolic trough to produce spot characteristics (e.g., a beam pattern of angular width substantially narrower than in the previous example).

The one or more surfaces may include at least a third surface 353 and/or a fourth surface 354 for subtending emissions from the LED. Surfaces 353, 354 may be flat, curved, convex, concave, parabolic, or any other suitable shape to subtend light. For example, surfaces 353, 354 may be formed of a single parabolic cup (e.g., having a single principal optical axis). In another example, each surface 353, 354 may be formed of its own parabolic cup (e.g., having distinct foci and distinct parallel or non-parallel principal optical axes). The third and fourth surfaces 353, 354 may produce a second subtending effect. For example, third and fourth surfaces 353, 354 may collimate emitted light along a vertical dimension of the parabolic cup to produce spot characteristics (e.g., a beam pattern of narrow angular width). In another example, third and fourth surfaces 353, 354 may collimate emitted light along a horizontal dimension of the parabolic cup. In another example, third and fourth surfaces 353, 354 may collimate emitted light along both vertical and horizontal dimensions of the parabolic cup.

The one or more surfaces may include at least the first, second, third, and fourth surfaces 351-354 for subtending emissions from the LED. For example, first and second surfaces 351, 352 may form a trough region with open ends (e.g., on right and left sides exemplified in FIG. 3A), and the open ends may be capped by third and fourth surfaces 353, 354 (e.g., to form the continuous wall of reflector 350). In another example, the surfaces may abut each other at corners. In another example, the corners may be filleted (e.g., fillets 359). In another example, each surface may produce its own subtending effect. In another example, reflector 350 may be formed integrally to include any one or more of the surfaces described herein.

Reflector 350 may have one or more pegs 357 extending therefrom at and/or adjacent to rearward opening 356, to enable interconnection with lens 340 and/or abutment with the PCBA (e.g., PCBA 225 of FIG. 2). For example, pegs 357 may enable adequate spacing between the one or more surfaces of reflector 350 and one or more LEDs on the PCB (e.g., LEDs 230 on PCBA 225 of FIG. 2). Adequate spacing between the one or more surfaces and the LEDs may enable optimal subtending of light emissions from the LEDs into a particular beam pattern (e.g., as illustrated in FIG. 7). Each peg 357 may include at least one pin 358 to enable interconnection with the PCBA (e.g., PCBA 225 of FIG. 2). For example, each pin 358 may be sized to interconnect with a corresponding slot in the PCBA (e.g., slots 226 in PCBA 225 of FIG. 2).

Lens 340 may be configured within the hollow interior of reflector 350. For example, lens 340 may be configured between first and second surfaces 351, 352, and/or between third and fourth surfaces 353, 354. In another example, lens 340 may be configured between forward opening 355 and rearward opening 356. Lens 340 may include a refractive portion 341 for subtending light emissions from the LEDs (e.g., LEDs 230 of FIG. 2). The precise manner in which refractive portion 341 subtends light may be described in greater detail herein (e.g., with respect to FIGS. 5A and 5B).

Figure 3A:
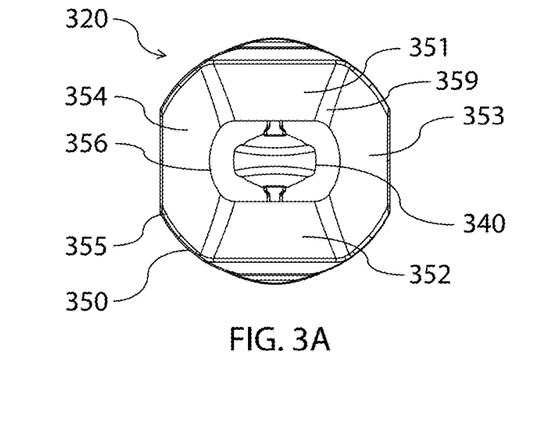
FIG. 3A illustrates a front side view of an optic configuration, according to an embodiment of the present invention.
Figure 3B:
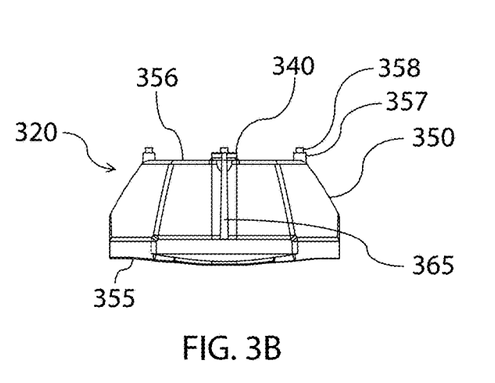
FIG. 3B illustrates a top side view of the optic configuration of FIG. 3A.
Figure 3C:
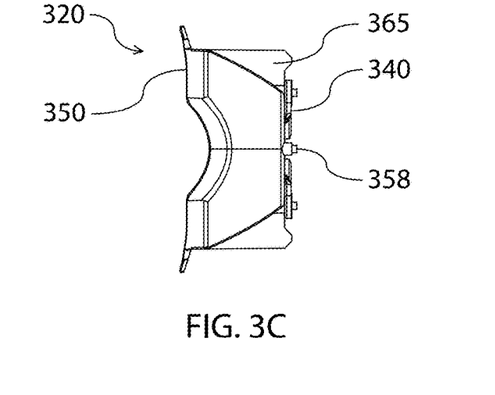
FIG. 3C illustrates a right side view of the optic configuration of FIG. 3A.

Lens 340 may further include one or more connecting portions 347 extending from the refractive portion 341 to reflector 350 to enable securement of lens 340 to reflector 350 and/or to the PCBA (e.g., PCBA 225 of FIG. 2). For example, connecting portion 347 may include a gripping portion 348 capable of interconnection with reflector 350. In another example, gripping portion 348 may interconnect with a peg 357 of reflector 350. In another example, gripping portion 348 may include an aperture 349 capable of receiving peg 357 of reflector 350. In another example, peg 357 may be received into gripping portion 348 in an interference fit. In another example, gripping portion 348 may include a slot (not shown) for receiving peg 357 (e.g., to enable some linear adjustment of lens 340 with respect to reflector 350). A person of ordinary skill in the art will appreciate the interchangeability of gripping portions 348 and pegs 357 as they are connected to lens 340 and reflector 350, respectively.

Figure 3D:
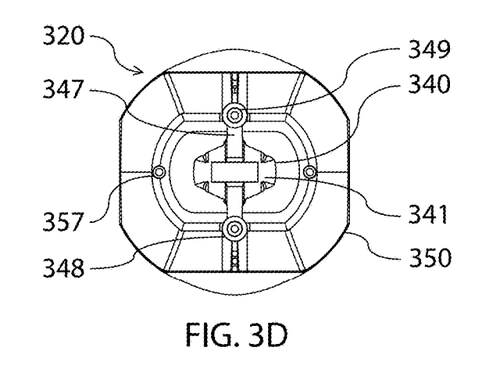
FIG. 3D illustrates a back side view of the optic configuration of FIG. 3A.

As illustrated in FIG. 3D, reflector 350 may have four pegs 357 positioned at points around rearward opening 356. Nevertheless, a person of ordinary skill in the art will appreciate that more or less pegs 357 may be included to optimize placement and/or positioning of reflector 350 with respect to lens 340 and/or the PCBA. Further, FIG. 3D illustrates two connecting portions 347 extending oppositely from refractive portion 341 to interconnect with two of the four pegs 357 of reflector 350. Nevertheless, a person of ordinary skill in the art will appreciate that more or less connecting portions 347 may be configured to optimize interconnection and/or positioning of lens 340 with respect to reflector 350 and/or the PCBA. Furthermore, a person of ordinary skill in the art will appreciate that connecting portions 347 need not be positioned oppositely.

Reflector 350 may have one or more retaining walls 365 extending therefrom to provide reflector 350 with additional stability in placement (e.g., against the PCBA) and/or increased rigidity (e.g., when compressed and/or secured between media 205 and housing 201 of FIG. 2). For example, at least one retaining wall 365 may extend across an exterior of reflector 350. In another example, at least one retaining wall 365 may substantially extend from the forward opening 355 to the rearward opening 356. In another example, at least one retaining wall 365 may substantially extend across a mid-span of one or more of the surfaces (e.g., first and second surfaces 351, 352). Further advantages of the one or more retaining walls 365 may be made more apparent in the discussion of other embodiments (e.g., with regard to retaining walls 465 of FIG. 4).

Figure 4A:
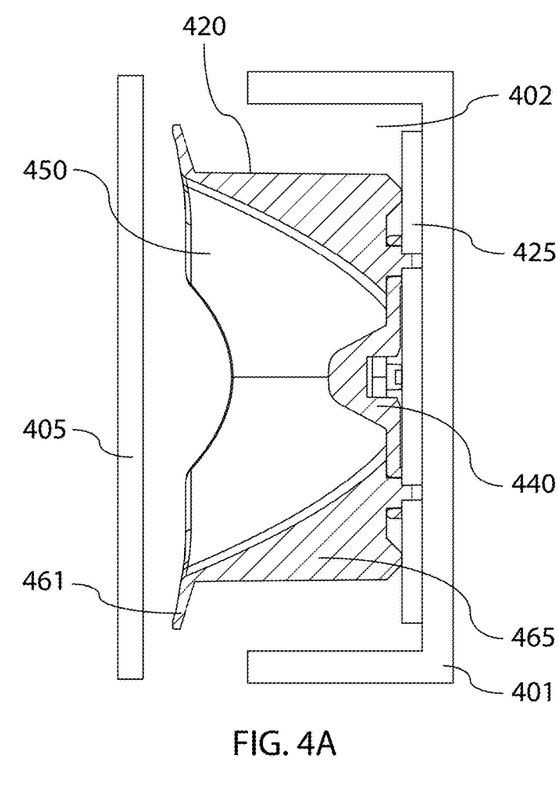
FIG. 4A illustrates a cross-sectional view of the optic configuration of FIG. 1 positioned in a housing with a media spaced from the optic configuration.
Figure 4B:
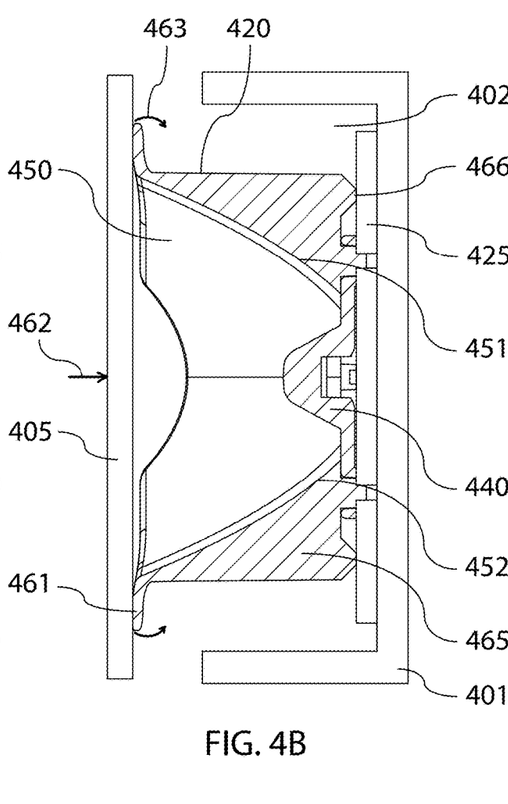
FIG. 4B illustrates a cross-sectional view of the optic configuration of FIG. 4A with the media abutting the optic configuration.

FIGS. 4A and 4B each illustrate a cross-sectional view of an optic configuration 420 at different stages of assembly within a housing 401 of a lighting fixture (e.g., lighting fixture 200 of FIG. 2). Housing 401 may have a cavity 402 capable of receiving optic configuration 420 therein. Optic configuration 420 may include a PCBA 425, which may be secured to housing 401 (e.g., via fasteners, not shown). Further, optic configuration 420 may include a reflector 450, which may be secured to PCBA 425 (e.g., via pins 358 of FIG. 3, and extending into slots 226 of FIG. 2). Further, optic configuration 420 may include a lens 440, which may be secured to PCBA 425 and/or reflector 450 (e.g., via connecting portions 347 of FIG. 3).

A media 405 may substantially extend across optic configuration 420 to enclose optic configuration 420 within cavity 402 (e.g., as exemplified in FIG. 1). In FIG. 4A, media 405 is illustrated in a spaced relationship with respect to optic configuration 420 and particularly with respect to reflector 450, whereas in FIG. 4B, media 405 is illustrated in an abutting and/or compressed relationship with respect to reflector 450. For example, media 405 may be compressed with a force (e.g., as indicated by arrow 462) against reflector 450 during assembly of the lighting fixture (e.g., due to compression exhibited by one or more bezels 107 as described with respect to FIG. 1). Accordingly, compression of optic configuration 420 between media 405 and housing 401 may tend to cause adverse deformation of reflector 450 (e.g., warping of first and second surfaces 351, 352 of FIG. 3) and/or deformation of light emissions from optic configuration 420.

To protect reflector 450 from deformation and/or to reduce deformation of light emissions, reflector 450 may include one or more tabs 461 extending therefrom to contact media 405 during assembly. For example, tabs 461 may experience a deflection (e.g., as indicated by arrows 463) in response to the force exhibited by media 405 during compression. In another example, reflector 450 may include one or more retaining walls 465 to prevent deformation of reflector 450 (e.g., first and second surfaces 451, 452 may each have a retaining wall 465). In another example, each retaining wall 465 may embody one or more of the characteristics discussed with reference to retaining walls 365 of FIG. 3. In another example, retaining walls 465 may include feet 466 to provide reflector 450 with greater stability when secured to PCBA 425. As illustrated in FIGS. 4A and 4B, retaining walls 465 may extend across an exterior of reflector 450 (e.g., opposite of a reflective surface), and may span first and second surfaces 451, 452 of reflector 450. Nevertheless, a person of ordinary skill in the art will appreciate that retaining walls 465 may extend from any surface of reflector 450 to provide additional support, stability, and/or resistance to deformation.

In accordance with the above principles, optic configuration 420 may be secured within cavity 402 by compression between media 405 and housing 401. Furthermore, additional fastening arrangements may be provided through the use of one or more fasteners (not shown). The object of any form of securement may be to enable optic configuration 420 to be held firmly and/or snugly in place within cavity 402 to prevent movement thereof during operation of the lighting fixture, while preventing deformation of reflector 450. Movement of optic configuration 420 and/or deformation of reflector 450 may be reduced or eliminated so as to prevent an adverse impact on a beam pattern produced by light emitted within optic assembly 420 and subtended by reflector 450 and/or lens 440.

Figure 5A:
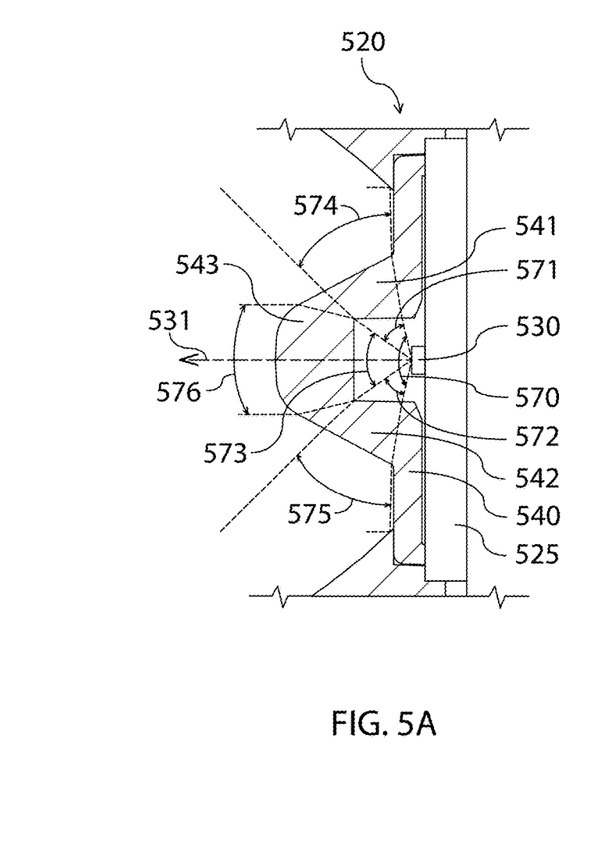
FIG. 5A illustrates a cross-sectional view of a portion of the optic configuration of FIG. 1 in a vertical dimension.
Figure 5B:
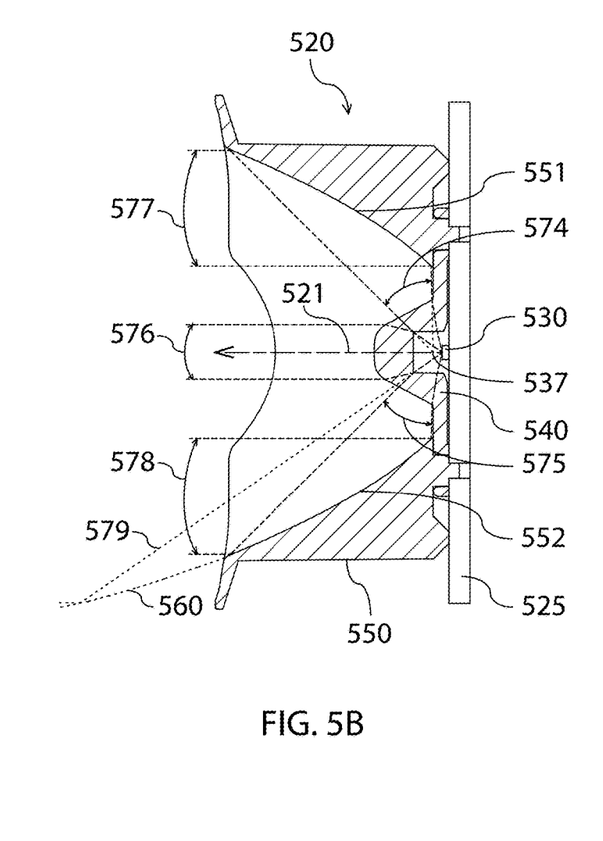
FIG. 5B illustrates a cross-sectional view of the optic configuration of FIG. 5A in the vertical dimension.

FIGS. 5A and 5B illustrate cross-sectional views of an optic configuration 520 (e.g., in a vertical dimension of lighting fixture 200 of FIG. 2). FIG. 5A illustrates a blown up view of the optic configuration 520 of FIG. 5B to highlight one or more LEDs 530 mounted on a PCBA 525 to emit light forwardly of the PCBA 525 (e.g., in the direction indicated by axis of symmetry 531). Substantially all of the light emitted by LEDs 530 in the cross-section of FIG. 5A may pass through a lens 540, such that the emitted light may be subtended by lens 540 (e.g., refracted). Accordingly, lens 540 may be formed of a material selected for its ability to transmit light therethrough.

In general, an emission source such as LEDs 530 may emit light within a span of emission, such that the span of emission may be described as having an axis of symmetry extending through the span of emission at a center thereof along any plane extending through the emission source. For example, one or more LEDs 530 may be described in terms of a span of emission 570 and/or as including an axis of symmetry 531 of the emitted light. Furthermore, an optic configuration may subtend emitted light into a subtended span, such that the subtended span may be described as having a principal optical axis extending through the span of emission at an approximate center thereof. For example, optic configuration 520 may be described in terms of one or more subtended spans (e.g., subtended spans 574-578) and/or a principal optical axis 521 of the subtended spans (e.g., as exemplified in FIG. 5B).

For example, the cross-section of FIGS. 5A and 5B illustrate LEDs 530, with an axis of symmetry 531 collinear with a principal optical axis 521 of the optic configuration 520. In another example, axis of symmetry 531 may be offset from and parallel to principal optical axis 521. In another example, axis of symmetry 531 may be inclined with respect to principal optical axis 521. As exemplified in FIG. 5B, the cross-sectional geometry of optic configuration 520 may be substantially symmetric above and below axis of symmetry 531 and/or principal optical axis 521. In another example, the cross-sectional geometry of optic configuration 520 may be non-symmetric with respect to axis of symmetry 531 and/or principle optical axis 521.

LEDs 530 may emit light in a span of emission 570 corresponding to axis of symmetry 531. For example, span of emission 570 may represent the total span for which LEDs 530 are capable of emitting light. In another example, span of emission 570 may represent an effective span of light emission (e.g., light emitted above a specified luminous intensity). In another example, span of emission 570 may be between about 90 degrees and about 180 degrees (e.g., about 160 degrees).

Span of emission 570 may be transmitted through lens 540, such that lens 540 may subtend span of emission 570. For example, span of emission 570 may be collimated, focused, shifted, and/or diffused by lens 540. In another example, light may refract upon entering into lens 540. In another example, light may refract upon exiting from lens 540. The extent of refraction of the emitted light may depend upon principles such as the angle of incidence with which light contacts lens 540 and/or the density of the material from which lens 540 is manufactured.

In order to optimize refraction of light, lens 540 may be shaped to subtend light through three distinct regions. For example, a first portion 571 of emitted light 570 may pass through a first region 541 of lens 540. In another example, a second portion 572 of emitted light 570 may pass through a second region 542 of lens 540. In another example, a third portion 573 of emitted light 570 may pass through a third region 543. Each region of lens 540 may subtend light similarly or differently from every other region.

First portion 571 may be subtended (e.g., refracted) by first region 541 to produce a subtended span of light 574. For example, first region 541 may cause first portion 571 to be collimated. In another example, first region 541 may cause first portion 571 to be focused (e.g., magnified). In another example, first region 541 may cause first portion 571 to be shifted (e.g., bent toward a first surface 551 of reflector 550 and/or away from axis of symmetry 531 as exemplified in FIG. 5A). In another example, first region 541 may cause first portion 571 to be diffused. In another example, first region 541 may cause any one or more of the above subtending effects. Similarly, the second portion 572 may be subtended (e.g., refracted) by second region 542 to produce a subtended span of light 575. For example, second region 542 may cause second portion 572 to be collimated, focused, shifted, diffused, and/or any combination thereof. For example, the subtending of light through first and second regions 541, 542 may be substantially symmetric about principal optical axis 521.

The third portion 573 of emitted light 570 may be subtended (e.g., refracted) by third region 543 to produce a subtended span of light 576 (e.g., as exemplified in FIGS. 5A and 5B). For example, third region 543 may cause third portion 573 to be collimated (e.g., in a direction substantially parallel to principal optical axis 521). In another example, third region 543 may cause third portion 573 to be focused (e.g., magnified into a narrower span about principal optical axis 521). In another example, third region 543 may cause third portion 573 to be shifted (e.g., in a direction inclined with respect to principal optical axis 521). In another example, third region 543 may cause third portion 573 to be diffused.

FIG. 5B illustrates the lens 540 of FIG. 5A, as well as the entire PCBA 525 and reflector 550 in cross-section. Reflector 550 may have at least a first surface 551 and a second surface 552 capable of subtending light emitted by LEDs 530. For example, first and second surfaces 551, 552 may be individual and/or collective segments of a parabolic trough. In another example, first and second surfaces may cause light emitted by LEDs 530 to be collimated, focused, shifted, diffused, or any combination thereof.

At least some of the light subtended by lens 540 may further be subtended by reflector 550. For example, subtended span of light 574 may be subtended (e.g., reflected) by first surface 551 to produce a subtended span of light 577. In another example, subtended span of light 575 may be subtended (e.g., reflected) by second surface 552 to produce a subtended span of light 578. In another example, subtended span of light 576 may travel out of optic configuration 520 without being subtended by reflector 550. Subtended spans 576-578 may be any one or more of collimated light, focused light, shifted light, and/or diffused light. Further, principal optical axis 521 may represent a line of symmetry of the subtended spans of light 576-578, collectively, and/or an approximate center of travel of the combined subtended spans 576-578.

Due to the subtending properties of lens 540, reflector 550 may be configured to be substantially smaller in a vertical and/or horizontal dimension than would otherwise be necessary in the absence of lens 540 (e.g., as exemplified with respect to phantom surface 560 and phantom light ray 579). Stated differently, without lens 540, reflector 550 may be required to be substantially larger in order to subtend all the light passing within first and second portions 571, 572. Therefore, lens 540 may provide the advantage of converting first and second portions 571, 572 into subtended spans of light 574, 575 in such a way as to enable reflector 550 to be substantially smaller. For example, as a result of the inclusion of lens 540, reflector 550 may be between about five percent and about sixty percent smaller (e.g., about thirty percent smaller) than a reflector capable of subtending the same span of emitted light without lens 540 (e.g., second portion 572).

As illustrated in FIG. 5B, one or more surfaces of reflector 550 may be appropriately sized to subtend light directed toward each respective surface (e.g., first surface 551 may be large enough to subtend all of subtended span of light 574). Due to the way in which lens 540 subtends light emitted by LEDs 530, the one or more surfaces of reflector 550 may have a focal point and/or focal axis 537 that is offset from the actual position of LEDs 530 (e.g., first surface 551 may capture and/or utilize subtended span of light 574 as though it had originated at a virtual source positioned at the focal point and/or along the focal axis 537 of first surface 551). For example, first surface 551 may be a parabolic trough with a focal axis 537 (e.g., extending into and out of the page of FIG. 5B), with LEDs 530 positioned behind the focal axis 537 rather than on the focal axis 537 (e.g., such that light emitted by LEDs 530 passes through focal axis 537, then beyond focal axis 537 through lens 540 and/or reflector 550).

Figure 6A:
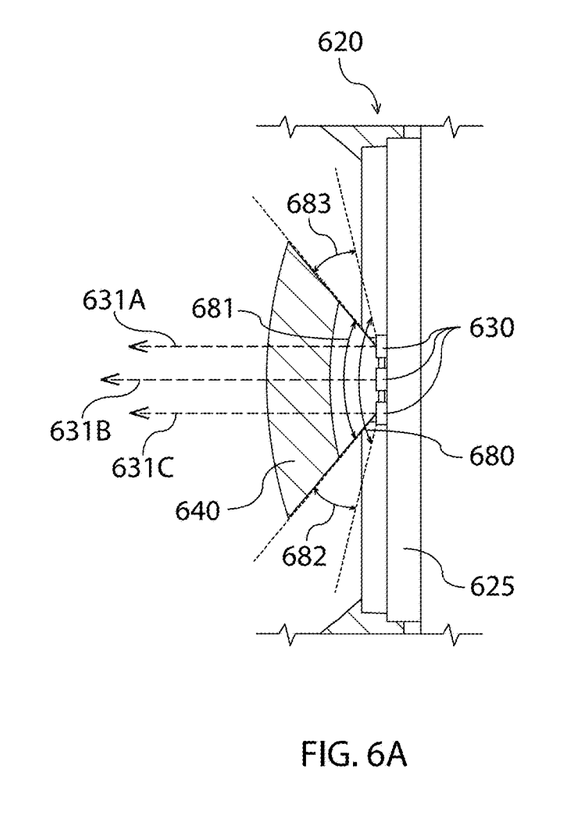
FIG. 6A illustrates a cross-sectional view of a portion of the optic configuration of FIG. 1 in a horizontal dimension.
Figure 6B:
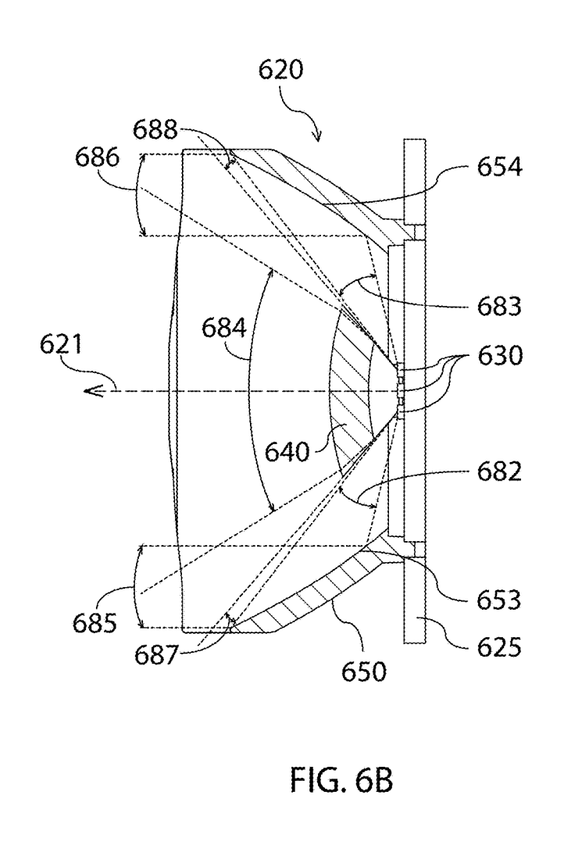
FIG. 6B illustrates a cross-sectional view of the optic configuration of FIG. 6A in the horizontal dimension.

FIGS. 6A and 6B illustrate cross-sectional views of an optic configuration 620 (e.g., in a horizontal dimension of lighting fixture 200 of FIG. 2). FIG. 6A illustrates a blown up view of the optic configuration 620 of FIG. 6B to highlight one or more LEDs 630 mounted on a PCB 625 to emit light forwardly of the PCB 625 (e.g., in the direction indicated by axes of symmetry 631A-631C). Each of LEDs 630 may be described in terms of an axis of symmetry 631, and a span of light emission, however, due to a substantial amount of overlap between the individual spans of light emission from each LED, the individual spans may be grouped together and described as a combined span of emission 680. For example, at least one axis of symmetry of an individual LED (e.g., axis of symmetry 631B) may approximate an axis of symmetry of the combined span of emission 680. In another example, the axes of symmetry of a plurality of LEDs may be non-parallel.

At least some of combined span of emission 680, emitted by LEDs 630, may pass through a lens 640, and may be subtended by lens 640 to produce a subtended span of light 684. For example, a first portion 681 of the combined span of emission 680 may be transmitted through lens 640 without being subtended. In another example, the first portion 681 may be subtended by lens 640 (e.g., refracted). Subtended span of light 684 may be one or more of collimated light (e.g., in a direction substantially parallel to principal optical axis 621), focused light (e.g., into a narrower span of light as exemplified in FIG. 6B), shifted light (e.g., into a direction inclined with respect to axis of symmetry 631B), and/or diffused light (e.g., into a wider span of light).

Further, at least some of combined span of emission 680, emitted by LEDs 630, may not pass through lens 640, but may pass directly to a reflector 650 and may be subtended by reflector 650 (e.g., as exemplified in FIG. 6B) to produce one or more subtended spans of light (e.g., subtended spans 685, 686). For example, a second portion 682 of the combined span of emission 680 may pass directly to and/or may be subtended by a third surface 653 (e.g., a parabolic cup) of reflector 650 to produce a subtended span of light 685. In another example, a third portion 683 of the combined span of emission 680 may be subtended by a fourth surface 654 (e.g., a parabolic cup) to produce a subtended span of light 686. Subtended spans of light 685, 686 may be any one or more of collimated, focused, shifted, and/or diffused light.

Further, some of combined span of emission 680, emitted by LEDs 630, may pass from optic configuration 620 without being subtended by either lens 640 and/or reflector 650 (e.g., spans of spill light 687, 688). Nevertheless, reflector 650 and lens 640 may be configured such that no spill light escapes optic configuration 620 without being subtended by either lens 640, reflector 650, or both. For example, where at least some light emitted by LEDs 630 may escape optic configuration 620 as spill light, optic configuration 620 may be positioned within a lighting fixture (e.g., lighting fixture 100 of FIG. 1), such that spill light may be captured and/or prevented from exiting the lighting fixture (e.g., by housing 101 of FIG. 1). In another example, spans of spill light 687, 688 may not form any part nor portion of a beam pattern formed by subtended spans 684-686 (e.g., beam pattern 790 of FIG. 7).

FIG. 7 illustrates an isocandela plot of a beam pattern 790 produced by an optic configuration (e.g., optic configuration 220 of FIG. 2). In general, an isocandela plots illustrate the luminous intensity of a light source, or photometric distribution of light from a light source, or, as in this case, the luminous intensity of a beam pattern produced by the optic configuration. Isocandela plots roughly resemble a contour map, where the contours indicate bands of intensity of the beam pattern being illustrated. For example, the isocandela plot may illustrate the beam pattern along a width-wise axis (e.g., axis L-R) corresponding to a horizontal dimension of the optic configuration and/or corresponding to a horizontal dimension of a lighting system (e.g., lighting system 100 of FIG. 1). In another example, the isocandela plot may illustrate the beam pattern along a height-wise axis (e.g., axis D-U) corresponding to a vertical dimension of the optic configuration and/or corresponding to a vertical dimension of the lighting system. In another example, incremental values extending along each axis may be based on incremental angles from the principal optical axis of the optic configuration (e.g., principal optical axis 521 of FIG. 5). In another example, the value 0 on both the L-R axis and the D-U axis may represent the point to which the principal optical axis extends. In another example, the value 10 on the L-R axis and −5 on the D-U axis may represent a rightward rotation of 10 degrees and a downward rotation of 5 degrees from the principal optical axis. In another example, beam pattern 790 may extend between a range of values along the L-R axis corresponding to a defined and designed for horizontal span of emission of the optic configuration, and between a range of values along the D-U axis corresponding to a defined and designed for vertical span of emission of the optic configuration.

Further, beam pattern 790 may have a particular luminous intensity at each point along the L-R and D-U axes. The isocandela plot may incrementally represent luminous intensity by one or more bands (e.g., bands 791, 792). For example, a first band 791 may represent a first luminous intensity (e.g., about 437 candela), and may represent a boundary between luminous intensities below and above the first luminous intensity. In this example, points along the L-R and D-U axes and outside band 791 may be less than the first luminous intensity, and points along the L-R and D-U axes and inside band 791 may be greater than the first luminous intensity. The first luminous intensity of first band 791 may be greater than zero. For example, the first luminous intensity may be higher than zero by an increment (e.g., about 437 candela).

In another example, a second band 792 may represent a second luminous intensity (e.g., about 875 candela). In this example, points along the L-R and D-U axes and outside band 792 may be less than the second luminous intensity, and points along the L-R and D-U axes and inside band 792 may be greater than the second luminous intensity. For example, band 792 may lie interior to and/or may be entirely enclosed by band 791 (e.g., such that band 792 represents a higher luminous intensity than band 791). In another example, band 792 may be greater than band 791 by the increment. Further, one or more additional bands may lie interior to band 792, and each subsequently interior band may represent an incrementally higher luminous intensity, where the difference between each band and the next higher band is about the increment (e.g., 1312, 1750, 2187, 2626, 3062, 3499, 3937, and so on).

Beam pattern 790 may appear to have a substantially oval shape 795, as exemplified in FIG. 7. Furthermore, beam pattern 790 may include a vertical dimension and a horizontal dimension substantially greater than the vertical dimension. For example, beam pattern 790 may span a horizontal dimension between about one times the vertical dimension and about five times the vertical dimension (e.g., about three times the vertical dimension). In another example, the horizontal dimension may span between about 40 degrees and about 140 degrees (e.g., about 100 degrees). In another example, the vertical dimension may span between about 10 degrees and about 70 degrees (e.g., about 30 degrees).

The horizontal dimension of beam pattern 790 may be the result of subtended spans of light produced by the optic configuration (e.g., subtended spans 576-578 of FIG. 5B and/or subtended span 684 of FIG. 6B). For example, one or more subtended spans of light (e.g., subtended spans 576-578 of FIG. 5B) may each be collimated, such that when combined the subtended spans substantially account for the relatively small vertical dimension of beam pattern 790. In another example, one or more subtended spans of light (e.g., subtended span 684 of FIG. 6) may each be focused, such that when combined the subtended spans substantially account for the relatively large horizontal dimension of beam pattern 790.

The oval shape 795 of beam pattern 790 may be formed of one or more bands representing incrementally increasing luminous intensity. For example, the highest luminous intensity of oval shape 795 may be between about 4,200 candela and about 6,200 candela (e.g., about 5,249 candela). At the center of oval shape 795, beam pattern 790 may include a high intensity spot 797 formed of bands of incrementally increasing luminous intensity that may be substantially circular in shape. High intensity spot 797 may lie interior to the band of highest luminous intensity of oval shape 795, and may include several more bands of incrementally higher luminous intensity.

For example, high intensity spot 797 may be between about a highest luminous intensity of the oval shape 795 and about ten times the highest luminous intensity of the oval shape 795 (e.g., about 3.67 times the highest luminous intensity of the oval shape 795). In another example, the highest luminous intensity of high intensity spot 797 may be between about 17,900 candela and about 19,700 candela (e.g., about 18,800 candela).

A person of ordinary skill in the art will appreciate that the LEDs of the various embodiments of the present invention may be one and the same, such that spans of emission from the LEDs may be one and the same, despite being represented differently in vertical, horizontal, or other dimensions. For example, a person of ordinary skill in the art will appreciate that some crossover may exist between the portions of light represented in FIGS. 5A and 5B as compared to the portions of light represented in FIGS. 6A and 6B. In another example, first, second, and third regions of a lens in one embodiment (e.g., regions 541-543 of 540 of FIG. 5) may be represented in one or more lenses of other embodiments (e.g., lens 640 of FIG. 6), though not discernable due to a difference in cross-section. In another example, at least a part of first, second, and third portions of light 571-573 of FIG. 5 may form first portion 681 of FIG. 6. In another example at least a part of first, second, and third portions of light 571-573 of FIG. 5 may form second and/or third portions 682, 683 of FIG. 6. In another example no part of first, second, and third portions of light 571-573 of FIG. 5 may form second and/or third portions 682, 683 of FIG. 6.

Thus a person of ordinary skill in the art will appreciate that emitted light forming beam pattern 790 may be a combination of emitted portions and subtended spans from one or more embodiments of the present invention. For example, emitted rays of light falling within first, second, and third portions of light 571-573 of FIG. 5A (e.g., within subtended spans 574-578 of FIGS. 5A and 5B) and falling within first portion 681 of FIG. 6A (e.g., within subtended span 684 of FIG. 6B) may substantially account for luminous intensity throughout oval shape 795. In another example, the combination of a lens (e.g., lens 540 of FIG. 5A and/or lens 640 of FIG. 6A) with one or more surfaces of a reflector (e.g., first and second surfaces 551, 552 of reflector 550 of FIG. 5B) may substantially account for luminous intensity throughout oval shape 795.

In another example, emitted rays of light falling within second and third portions 682, 683 of FIG. 6A (e.g., within subtended spans 685, 686 of FIG. 6B) may substantially account for luminous intensity within high intensity spot 797 of beam pattern 790. In another example, one or more surfaces of a reflector (e.g., third and fourth surfaces 653, 654 of reflector 650 of FIG. 6B) may substantially account for luminous intensity within high intensity spot 797. Thus, high intensity spot 797 may be a result of the subtended spans which form the oval shape 795, and/or may further be the result of additional subtended spans of light produced by the optic configuration (e.g., subtended spans 685, 686 of FIG. 6B). Accordingly, beam pattern 790 may be formed of a high intensity spot 797 in combination with a relatively lower intensity flood light (e.g., the oval shape 795), which enables significantly more flooding of light in the horizontal dimension than in the vertical dimension.

Thus, where the optic configuration producing beam pattern 790 is configured on a mounting surface (e.g., of a vehicle), the oval shape 795 may enable illumination of environmental conditions relatively close to the mounting surface. For example, oval shape 795 may illuminate environmental conditions at a distance from the mounting surface of between about 0.0 feet and about 260 feet (e.g., about 238 feet). Alternatively, the high intensity spot 797 may enable illumination of environmental conditions much further from the mounting surface. For example, high intensity spot 797 may illuminate environmental conditions at a distance from the mounting surface of between about 0.0 feet and about 480 feet (e.g., about 450 feet). Thus, the optic configuration producing beam pattern 790 may be configured as a dual purpose light emitting system which caters to both narrower longer distance illumination as well as wider shorter distance illumination.

Other aspects and embodiments of the present invention will be apparent to those skilled in the art from consideration of the specification and practice of the invention disclosed herein. It is intended, therefore, that the specification and illustrated embodiments be considered as examples only, with a true scope and spirit of the invention being indicated by the following claims.

What is claimed is:

1. An optic configuration, the optic configuration insertable between a media and a housing of a lighting fixture, the optic configuration comprising:
   a PCBA;
   one or more LEDs configured on the PCBA to emit light;
   a lens configured on the PCBA to subtend a portion of the emitted light from the LEDs into one or more subtended spans; and
   a reflector configured on the PCBA to subtend at least one of the one or more subtended spans from the lens, the reflector further configured to subtend a portion of the emitted light from the LEDs.

2. The optic configuration of claim 1, wherein the lens includes a refractive portion configured to subtend light emitted by the one or more LEDs into two or more subtended spans of light.

3. The optic configuration of claim 1, wherein the lens includes a gripping portion configured to enable attachment of the lens to the reflector.

4. The optic configuration of claim 1, wherein the reflector includes one or more surfaces forming a reflective wall such that the one or more LEDs emit light through a rearward opening of the reflector and toward a forward opening of the reflector.

5. The optic configuration of claim 4, wherein the one or more surfaces of the reflector includes at least one parabolic trough.

6. The optic configuration of claim 4, wherein the one or more surfaces of the reflector includes at least one parabolic cup.

7. The optic configuration of claim 4, wherein the lens is configured at the rearward opening of the reflector.

8. The optic configuration of claim 4, wherein the reflector includes one or more tabs extending from the forward opening, the one or more tabs configured to deflect in response to an applied force.

9. A lighting fixture, comprising:
   a housing;
   an optic configuration configured on the housing, the optic configuration including a reflector with one or more tabs extending from the reflector; and
   a media configured over the optic configuration, wherein the media contacts the tabs, and wherein the tabs are configured to deflect in response to a force exerted on the media.

10. The lighting fixture of claim 9, wherein the optic configuration includes a PCBA and one or more LEDs configured on the PCBA to emit light.

11. The lighting fixture of claim 10, wherein at least one of the one or more LEDs is configured to emit light from a rearward opening to a forward opening of the reflector.

12. The lighting fixture of claim 10, wherein at least one of the one or more LEDs is configured on the PCBA to emit light through the media between a perimeter of the housing and a perimeter of the optic configuration.

13. A method, comprising:
   emitting light from one or more LEDs;
   transforming a first portion of the emitted light into a first subtended span by passing the first portion of emitted light through a first region of a lens, such that the first subtended span is directed more closely to a principal optical axis of the lens; and
   transforming a second portion of the emitted light into a second subtended span by passing the second portion of emitted light through a second region of the lens, such that the second subtended span is directed away from the principal optical axis of the lens.

14. The method of claim 13, further including:
   transforming the second subtended span into a new subtended span by passing the second subtended span against a surface of a reflector, such that the new subtended span is directed more closely to the principal optical axis of the lens.

15. The method of claim 14, wherein the first and new subtended spans of light form an oval shaped photometric distribution.

16. The method of claim 13, further including:
   transforming a new portion of the emitted light into a new subtended span by passing the new portion of emitted light against a surface of a reflector, such that the new subtended span is directed substantially parallel to the principal optical axis of the lens.

17. The method of claim 16, wherein the new subtended span forms a high intensity spot photometric distribution.

18. The method of claim 13, further including:
   transforming a third portion of the emitted light into a third subtended span by passing the third portion of emitted light through a third region of the lens, such that the third subtended span is directed away from the principal optical axis of the lens.

19. The method of claim 18, further including:
   transforming the second and third subtended spans into fourth and fifth subtended spans, respectively, by passing the second and third subtended spans against first and second surfaces of a reflector, respectively, such that the fourth and fifth subtended spans are directed more closely to the principal optical axis of the lens.

20. The method of claim 19, further including:
   transforming fourth and fifth portions of the emitted light into sixth and seventh subtended spans, respectively, by passing the fourth and fifth portions of emitted light against third and fourth surfaces of the reflector, such that the sixth and seventh subtended spans are directed substantially parallel to the principal optical axis of the lens.

* * * * *